United States Patent [19]

Thong et al.

[11] Patent Number: 4,654,634

[45] Date of Patent: Mar. 31, 1987

[54] APPARATUS FOR PROCESSING A SEQUENCE OF DIGITAL DATA VALUES

[75] Inventors: Tran Thong; Shiv K. Balakrishnan, both of Beaverton, Oreg.

[73] Assignee: Tektronix, Inc., Beaverton, Oreg.

[21] Appl. No.: 849,361

[22] Filed: Apr. 7, 1986

Related U.S. Application Data

[63] Continuation of Ser. No. 475,807, Mar. 16, 1983, abandoned.

[51] Int. Cl.⁴ ............................................. H03M 1/00
[52] U.S. Cl. ........................... 340/347 R; 324/121 R; 340/347 AD; 340/347 DA; 340/347 CC; 364/178
[58] Field of Search ................. 340/347 DA, 347 CC, 340/347 M; 375/26, 34, 51, 57, 58; 324/121 R; 358/166, 167, 138; 364/575–577, 169, 178

[56] References Cited

U.S. PATENT DOCUMENTS 3,048,781  8/1962  Glaser ................................... 375/26
4,244,004  1/1981  Yamada .............................. 358/138

Primary Examiner—T. J. Sloyan
Attorney, Agent, or Firm—John Smith-Hill; Robert S. Hulse

[57] ABSTRACT

A sequence of digital data values is processed by deriving the average $W_n$ of two of the data values $X_{n-1}$ and $X_{n+1}$. If $W_n$ lies within the quantization step q centered on the data value $X_n$, $W_n$ is adopted as a modified value of $X_n$, but if $W_n$ lies outside the quantization step the modified value of $X_n$ is taken to be $X_n+q/2$ or $X_n-q/2$, depending on whether $W_n$ is greater or less than $X_n$.

3 Claims, 7 Drawing Figures

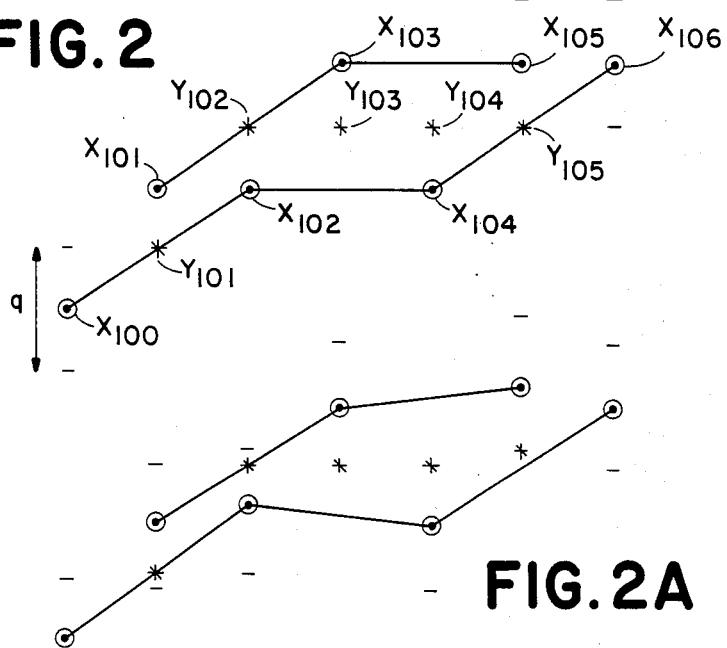
FIG. 2
FIG. 2A
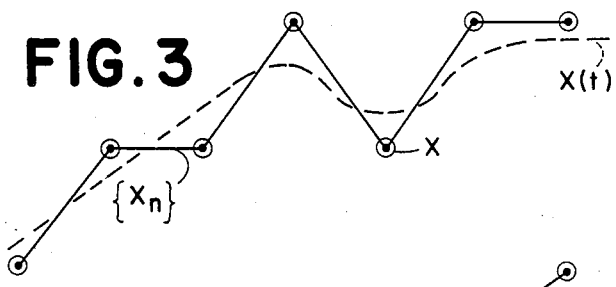
FIG. 3
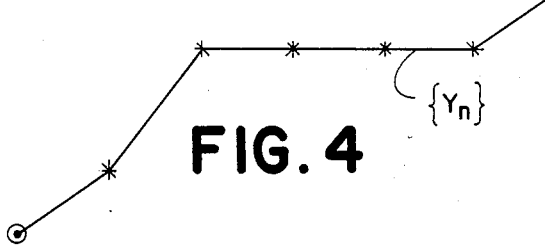
FIG. 4 ered data in the RAM 22 is processed by a central processing unit (CPU) such as a conventional microprocessor in accordance with a program (algorithm) stored in a read-only memory (ROM) 26. This program will be further discussed in detail hereinafter. The processed

APPARATUS FOR PROCESSING A SEQUENCE OF DIGITAL DATA VALUES

This is a continuation of application Ser. No. 475,807 filed Mar. 16, 1983 and now abandoned.

This invention relates to a method of processing a sequence of digital data values.

BACKGROUND OF THE INVENTION

An analog-to-digital converter (ADC) is used to convert an analog signal into a digital signal for storing it in a digital memory or processing it with a computer. The digital signal in the memory may be converted into an analog signal by a digital-to-analog converter (DAC) for displaying the reproduced analog signal on a display device. One example of an electronic instrument having such functions is known as a digital storage oscilloscope. If a high-resolution ADC is used in a digital storage oscilloscope, the input analog signal is reproduced accurately and smoothly. However, high-resolution ADCs are expensive and complex in construction. On the other hand, if a low-resolution ADC is used in a digital storage oscilloscope, the displayed waveform is rough. This rough waveform is obtained because the output from the ADC includes an error of up to half of the least significant bit (LSB) of the ADC, and the value q corresponding to the LSB of a low-resolution ADC is larger than that of a high-resolution ADC.

Several techniques have been proposed to increase the ratio of signal-to-quantization noise of a digitized repetitive signal for enhancing apparent resolution so as to display the reproduced signal smoothly. One such technique is averaging, which accumulates values at corresponding points of the repetitive signal. Another technique is dithering, which offsets the corresponding points of the repetitive signal according to a predetermined algorithm. Dithering may also be used in conjunction with averaging. Averaging is not applicable to single-shot waveform acquisition and display.

SUMMARY OF THE INVENTION

According to a first aspect of the present invention there is provided a method of processing a sequence of digital data values $X_0 - - - X_{n-1}, X_n, X_{n+1} - - - X_m$, where n and m are integers and m is greater than n, comprising the steps of:

(a) computing $W_n = (X_{n-1} + X_{n+1})/2$;

(b) utilizing $W_n$ and $X_n$ to derive a modified value $Y_n$ for $X_n$ according to the rules (i) if $|W_n - X_n| \leq q/2$, where q is the effective quantization step of the sequence of digital values, setting $Y_n = W_n$, (ii) if $|W_n - X_n| > q/2$ and $W_n > X_n$, setting $Y_n = X_n + q/2$, and (iii) if $|W_n - X_n| > q/2$ and $W_n < X_n$, setting $Y_n = X_n - q/2$; and (c) substituting $Y_n$ for $X_n$ in the sequence of digital data values.

According to a second aspect of the present invention there is provided apparatus for processing an analog electrical signal, comprising an analog-to-digital converter having an effective quantization step q for converting the analog electrical signal into a sequence of digital data values $X_0 - - - X_{n-1}, X_n, X_{n+1} - - - X_m$, where n and m are positive integers and m is greater than n, and a processing unit connected to receive the sequence of digital data values and programmed to perform the following operations:

(a) compute $W_n = (X_{n-1} + X_{n+1})/2$;

(b) derive a modified value $Y_n$ for $X_n$ according to the rules (i) if $|W_n - X_n| \leq q/2$, setting $Y_n = W_n$, (ii) if $|W_n - X_n| > q/2$ and $W_n > X_n$, setting $Y_n = X_n + q/2$, and (iii) if $|W_n - X_n| > q/2$ and $W_n < X_n$, setting $Y_n = X_n - q/2$; and (c) substitute $Y_n$ for $X_n$ in the sequence of digital data values.

The present invention thus provides a method of processing a sequence of digital data values which, if applied to the digital data values outputted by the ADC of a digital storage oscilloscope in response to a single-shot input waveform, enables the apparent resolution of the display to be improved, by smoothing discontinuities that would otherwise be observed. This improvement in resolution is obtained even if the input waveform contains fast transition, such as can be found in a square wave.

The invention operates on the principle of a constrained filter. If the interpolated value between $X_{n-1}$ and $X_{n+1}$ lies within the quantization step centered on $X_n$, the interpolated value is adopted as the modified value of $X_n$, but if the interpolated value lies outside the quantization step, the modified value of $X_n$ is taken to be $X_n + q/2$ or $X_n = q/2$, depending on whether the interpolated value is greater or less than $X_n$. Thus, the method recognizes a limit of q/2 on the amount by which $X_n$ can be modified by interpolation.

BRIEF DESCRIPTION OF THE DRAWINGS

FIGS. 2 and 2A are graphs of data values against sample numbers, illustrating the manner in which digital signals are interpolated by a method embodying the present invention;

FIGS. 3 and 4 are graphs illustrating the improvements in apparent resolution obtained by means of the invention.

FIG. 5 illustrates the manner in which the contents of a memory of the oscilloscope are organized.

DETAILED DESCRIPTION

Figure 1:
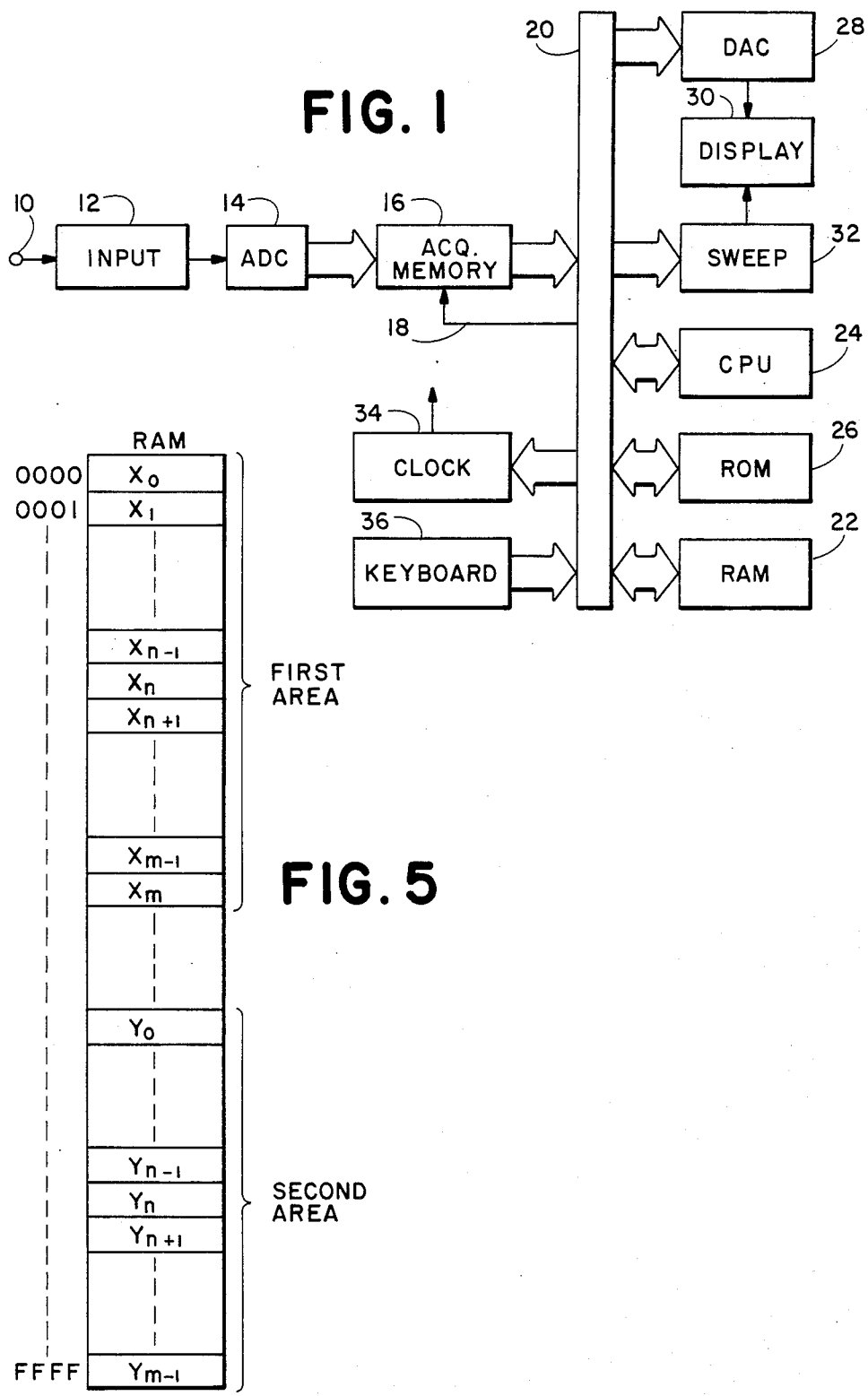
FIG. 1 is a block diagram of a digital storage oscilloscope.

An input analog signal representing an event of interest is received at the input terminal 10 of the oscilloscope shown in FIG. 1 and is applied to a conventional ADC 14 through an input circuit 12. The event may be an electrical event of interest in the case that the oscilloscope is used to test operation of an electrical circuit, or it may be some other physical event which is transformed into an electrical signal by a suitable transducer (not shown). The digitized waveform data from the ADC 14 is stored in an acquisition memory 16, the operation mode (read/write mode) of which is controlled by a control line 18 connected to a bus 20 (including data, address and control lines). The stored data in the memory 16 is transferred to a first area of a random access memory (RAM) 22. The digital data in the first area of the RAM 22 is processed by a central processing unit (CPU) such as a conventional microprocessor in accordance with a program (algorithm) stored in a read-only memory (ROM) 26. This program will be further discussed in detail hereinafter. The processed data is stored in a second area of the RAM 22, and is transferred through the bus 20 to a DAC 28 for reproducing an analog waveform. A display device 30, such as a CRT (cathode ray tube), receives the outputs from the DAC 28 and a sweep circuit 32 for displaying the reproduced analog waveform. A clock generator 34 applies a clock signal to other blocks (not shown), and a keyboard 36 acts as an input device for setting and controlling operation of the oscilloscope. The CPU 24 controls the operation of the oscilloscope in accordance with the program in the ROM 26.

The basic theory of the program stored in the ROM 26 is as follows. An analog signal X(t) is applied to the ADC 14, which digitizes the signal under control of a constant frequency clock signal and provides as an output signal a sequence of digital data words $X_0$ - - - $X_{n-1}$, $X_n$, $X_{n+1}$ - - - $X_m$ (n and m are are positive integers and m is larger than n). Assuming that the ADC is accurate, the actual value X(nT) of the analog signal X(t) at the time of the $n^{th}$ sampling pulse is in the range between $X_n-q/2$ and $X_n+q/2$, where q is the effective quantization step of the ADC, i.e. the change in value of X(t) corresponding to a change in the LSB of the ADC. If the average of $X_{n-1}$ and $X_{n+1}$ is used as the modified data word $Y_n$, the reproduced waveform will be displayed smoothly. However, $Y_n$ may not be within q/2 from X(nT), because the difference $V_n$ between the average and actual data may be larger than q/2. The program judges whether the difference $V_n$ is larger than q/2. If the difference $V_n$ is smaller than q/2, the modified data $Y_n$ is the average value as shown in FIG. 2 for the sample 102. If the difference $V_n$ is larger than q/2 and $X_n$ is smaller than the average value, the modified data $Y_n$ is $X_n+q/2$ as shown for the sample 104. If the difference $V_n$ is larger than q/2 and $X_n$ is larger than the average value, $Y_n$ is $X_n-q/2$ as shown for the sample 103.

It will be appreciated that the RAM 22, the CPU 24, and the DAC 28 must be able to handle digital data words $Y_n$ having a greater number of bits than the number of bits to which X(nT) is quantized by the ADC 14. For example, if the ADC 14 quantizes to 6 bits (64 levels), the RAM 22, CPU 24 and DAC 28 might be designed to operate with 8 bits (256 levels).

Figure 6:
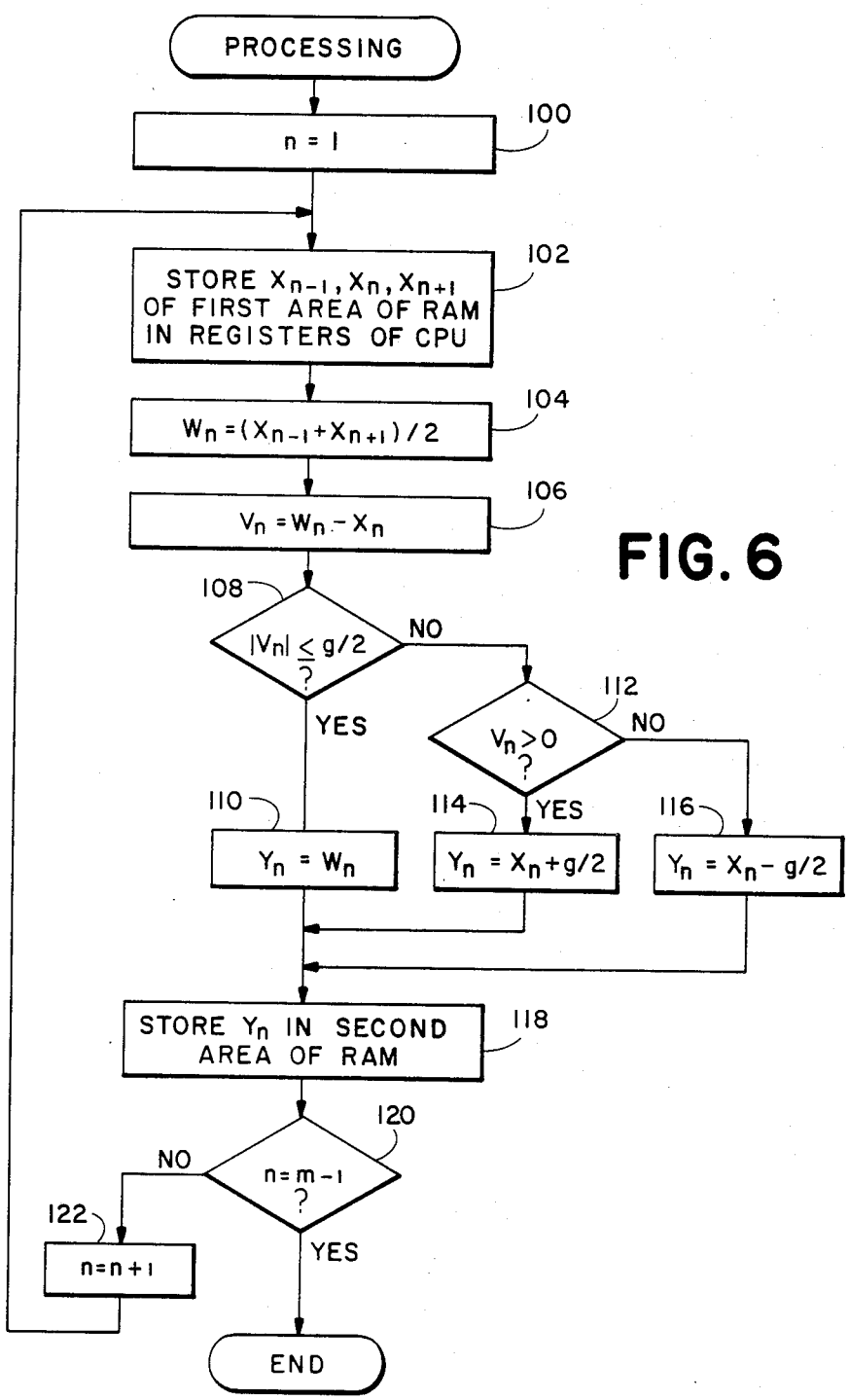
FIG. 6 is a flow chart.

An example of the foregoing program will be discussed in conjunction with FIGS. 5 and 6.

STEP (100): n is set to 1.

STEP (102): The digital data $X_{n-1}$, $X_n$ and $X_{n+1}$ stored in the first area of RAM 22 are transferred to registers of CPU 24.

STEP (104): CPU 24 computes the average $W_n$ of $X_{n-1}$ and $X_{n+1}$, namely, $(X_{n-1}+X_{n+1})/2$, and stores $W_n$.

STEP (106): CPU 24 computes the difference $V_n$ between the average $W_n$ and the digital data $X_n$, and stores $V_n$.

STEP (108): CPU 24 judges whether the absolute value of $V_n$ is equal to or smaller than q/2. If so, step 110 follows. If not, step 112 follows.

STEP (110): CPU 24 outputs the average $W_n$ as $Y_n$.

STEP (112): CPU 24 judges whether or not the difference $V_n$ is positive. If so, step 114 follows. If not, step 116 follows.

STEP (114): CPU outputs $(X_n+q/2)$ as $Y_n$.

STEP (116): CPU 24 outputs $(X_n-q/2)$ as $Y_n$.

STEP (118): $Y_n$ is stored in the second area of RAM 22.

STEP (120): CPU 24 judges whether or not n is equal to (m−1). If so, the program has been completed. If not, step 122 follows.

STEP (122): n is set to (n+1) by CPU 122, and step 102 follows.

The foregoing program steps and the value of q are stored in the ROM 26.

FIGS. 3 and 4 are displays on device 30 corresponding to the digitized data $X_n$ and the modified data $Y_n$. In FIG. 3, the waveform of the input signal X(t) is shown by a dashed line. It will be apparent that the modified data $Y_n$ makes a smoother waveform than does the data $X_n$.

The described program permits an improvement in the apparent resolution of a display of single-shot waveform data acquired using a low-resolution ADC. Since the program is based on the fact that the digitized data $X_n$ from the continuous waveform is within q/2 of the actual sample value X(nT), and the modified data $Y_n$ lies with the range $X_n-q/2$ to $X_n+q/2$, the display of the reproduced waveform is not substantially degraded. Thus, the present invention is most useful when a display of higher resolution than the ADC is used.

The technique described herein provides particularly good results when used with a signal (stored in the memory 16) which is known to contain fairly large and essentially random variations. This occurs, for example, if dithering is used to modify the signal applied to the ADC 14 (dithering being the intentional addition of white noise to the input signal) or if charge-coupled devices (CCDs) are used to quantize the input signal, CCDs being large sources of noise. In the case of dithering, an analog version of the dither signal is added to the input to the ADC 14, and a digital version is subtracted from the output of the ADC. One result is that input to the acquisition memory 16 is quantized to a larger number of bits than is the output of the ADC 14, and thus the values of $X_n$ may be intermediate the quantization levels of the ADC 14. In this case, the graph of FIG. 2 would be changed to have an appearance such as shown in FIG. 2A. It will be appreciated that without dithering the value of $Y_n$ will always be equal to $X_n$ or $X_n\pm q/2$. By introducing dithering, the value of $Y_n$ can take an intermediate value in the range from $X_n-q/2$ to $X_n$ or from $X_n$ to $X_n+q/2$.

The invention normally yields relatively little improvement with a ADC 14 which quantizes to 8 or more bits. However, the performance of a conventional 8 bit ADC is degraded, and it may only yield say 4 bits of accuracy, if the input signal has high speed transitions, and in such a case the invention will yield significant improvements in the apparent resolution of the display. However, the value of q that is used must be that which corresponds to the effective quantization step of the ADC, i.e. one-sixteenth of the maximum dynamic range of the input signal in the case of the example, since 4 bits provide 16 quantization levels.

It will be appreciated by those skilled in the art that the invention is not restricted to the specific method and apparatus which have been described, since variations may be made therein without departing from the scope of the present invention as defined in the appended claims, and equivalents thereof. For example, the processing method of the present invention may be repeated to gain further improvement in the appearance of the waveform display, and since the averaging process used is a form of filtering, more complex digital filtering can also be used.

We claim:

1. Apparatus for providing a visual representation of a physical event of interest, comprising an input terminal for receiving an analog electrical input signal representative of the physical event, analog-to-digital converter means for converting the analog electrical input signal into a sequence of digital data values $X_0 \text{ - - - } X_{n-1}, X_n, X_{n+1} \text{ - - - } X_m$ each having j digits, where j, m and n are positive integers and m is greater than n, the sequence of digital data values having an effective quantization step q, means for processing the sequence of digital data values to provide a modified sequence of digital data values $Y_0 \text{ - - - } Y_{n-1}, Y_n, Y_{n+1} \text{ - - - } Y_m$ each having k digits, where k is a positive integer greater than j, such that $Y_n$ is equal to the average of $X_{n-1}$ and $X_{n+1}$ unless said average differs from $X_n$ by more than $q/2$, in which event $Y_n$ is equal to $X_n+q/2$ if the average is greater than $X_n$ and $Y_n$ is equal to $X_n-q/2$ if the average is less than $X_n$, digital-to-analog converter means for converting the modified sequence of digital data values to analog form so as to provide an analog electrical output signal of greater apparent resolution than the analog electrical input signal, and visual display apparatus connected to receive the analog electrical output signal to generate a visual display of the waveform of the analog electrical output signal.

2. A digital storage oscilloscope comprising an input terminal at which the oscilloscope receives an analog electrical input signal, an analog-to-digital converter coupled to the input terminal and having an effective quantization step q for converting the analog electrical input signal into a sequence of digital data values $X_0 \text{ - - } X_{n-1}, X_n, X_{n+1} \ldots X_m$ each having j digits, where j, m and n are positive integers and m is greater than n, an acquisition memory for storing the sequence of digital data values, means for processing the sequence of digital data values to provide a modified sequence of digital data values $Y_0 \text{ - - - } Y_{n-1}, Y_n, Y_{n+1} \text{ - - - } Y_m$ each having k digits, where k is a positive integer greater than j, such that $Y_n$ is equal to the average of $X_{n-1}$ and $X_{n+1}$ unless said average differs from $X_n$ by more than $q/2$, in which event $Y_n$ is equal to $X_n+q/2$ if the average is greater than $X_n$ and $Y_n$ is equal to $X_n-q/2$ if the average is less than $X_n$, a digital-to-analog converter for converting the modified sequence of digital data values to analog form so as to provide an analog electrical output signal of greater apparent resolution than the analog electrical input signal, and a display device connected to receive the analog electrical output signal and provide a visible display of the waveform of the analog electrical output signal.

3. An oscilloscope according to claim 2, wherein the processing means are programmed to perform the following operations:
 (a) compute $W_n=(X_{n-1}+X_{n+1})/2$;
 (b) derive $Y_n$ according to the rules
  (i) if the absolute value of $W_n-X_n$ is less than or equal to $q/2$, setting $Y_n$ equal to $W_n$,
  (ii) if the absolute value of $W_n-X_n$ is greater than $q/2$ and $W_n$ is greater than $X_n$, setting $Y_n$ equal to $X_n+q/2$, and
  (iii) if the absolute value of $W_n-X_n$ is greater than $q/2$ and $W_n$ is less than $X_n$, setting $Y_n$ equal to $X_n-q/2$.

* * * * *